United States Patent [19]
Yeh

[11] Patent Number: 5,278,793
[45] Date of Patent: Jan. 11, 1994

[54] MEMORY DEFECT MASKING DEVICE

[76] Inventor: Tsuei-Chi Yeh, No. 105-12, Shang-Keng-Tzu-Kou, Hsin-Feng Hsiang, Hsinchu Hsien, Taiwan

[21] Appl. No.: 841,158

[22] Filed: Feb. 25, 1992

[51] Int. Cl.$^5$ .............................................. G11C 7/00
[52] U.S. Cl. ................................ 365/200; 365/230.03; 371/10.2
[58] Field of Search ................. 365/200, 96; 371/10.1, 371/10.2, 10.3, 21.1, 21.2, 21.3, 8.1

[56] References Cited
U.S. PATENT DOCUMENTS

| | | | |
|---|---|---|---|
| 4,722,822 | 2/1988 | Thai et al. | 365/96 |
| 4,733,372 | 3/1988 | Nanbu et al. | 365/200 |
| 4,829,480 | 5/1989 | Seo | 365/200 |
| 4,879,687 | 11/1989 | Okamoto et al. | 365/200 |
| 4,891,683 | 1/1990 | Chua | 365/96 |
| 4,975,881 | 12/1990 | Kagami | 371/10.3 |
| 5,122,987 | 6/1992 | Kihara | 365/200 |
| 5,153,880 | 10/1992 | Owen et al. | 365/200 |
| 5,179,536 | 1/1993 | Kasa et al. | 365/200 |

Primary Examiner—Eugene R. LaRoche
Assistant Examiner—Vu A.. Le
Attorney, Agent, or Firm—Lowe, Price, LeBlanc & Becker

[57] ABSTRACT

A memory defect masking device is to be used in combination with defective memory devices. The memory masking device first stores the addresses of defective memory spaces of the defective memory devices therein and then compares the memory address present at the address lines of the defective memory devices with the addresses stored therein. The defective memory devices are disabled when the memory address present at the address lines tallies with one of the addresses stored in the memory defect masking device. The memory defect masking device is also connected to the data lines of the defective memory devices to permit the former to act as a replacement for the defective space of the defective memory devices. The defective memory devices is therefore operated as if it has no defective memory space.

8 Claims, 16 Drawing Sheets

MEMORY DEFECT MASKING DEVICE

BACKGROUND OF THE INVENTION

1. Field of the Invention

The invention relates to a memory defect masking device, more particularly to a memory defect masking device which is to be used in combination with a plurality of memory devices and which is capable of replacing the defective memory spaces of the memory devices.

2. Description of the Related Art

Good yield rate is an important consideration when manufacturing memory chips. There are two ways to improve the yield rate of memory chips. The first way is to improve the manufacturing process so as to reduce the occurrence of defective memory chips. The second way is to modify the construction of the memory chips. Such modifications have been disclosed in U.S. Pat. Nos. 4,733,372 and 4,829,480. FIG. 1 is an illustration of a conventional 1M Bit DRAM (dynamic RAM) unit. The DRAM unit comprises a memory array (100) having 512 rows and 2048 columns. The DRAM unit is further provided with redundant memory rows (110) and/or columns (120). After the DRAM unit is manufactured, the DRAM unit undergoes a sorting stage so as to determine whether or not the DRAM unit is defective. If the DRAM unit has a defective memory space, the corresponding row or column fuses (130, 140) is cut so as to disable the defective memory space. A redundant memory row or column (110, 120) is then connected via the redundant row or column decoders (112, 122) so as to serve as a replacement for the defective memory space. This illustrates how the defective memory spaces of a DRAM unit are conventionally repaired.

The main drawback of the above disclosed repairing procedure is as follows: The entire row or column is replaced when a defective memory bit is found. In the 1M Bit DRAM example, each column has 512 bits while each row has 2048 bits. Thus, a minimum of 512 bits of redundant memory column is needed to repair a defective memory bit.

As the number of defective memory spaces increases, the required number of redundant memory rows or columns correspondingly increases, thereby increasing the size of the memory chip. This illustrates why it is impractical to provide a large number of redundant memory rows or columns. However, it is possible that the number of defective memory spaces will exceed the allocated number of redundant memory rows or columns. The memory chip is therefore beyond repair and should thus be discarded. The manufacturer should therefore choose a proper number of redundant memory rows or columns so as to minimize the number of memory chips which are beyond repair while limiting the increase in the size of the memory chip.

The DRAM units undergo a packaging process after being sorted. It is possible that some of the packaged DRAM chips will be found defective during further burn-in and testing processes. Since defect has been detected after the DRAM units have already been packaged, the above described repairing procedure cannot be employed to correct the defective memory chips. Thus, the defective DRAM units are also beyond repair and should be discarded.

SUMMARY OF THE INVENTION

Therefore, the main objective of the present invention is to provide a memory defect masking device to be used in combination with a plurality of memory devices which is capable of replacing the defective memory spaces of the memory devices, thereby permitting the memory devices to operate as if no defective memory space exists. The memory defect masking device of the present invention can be adapted for use with different kinds of memory devices, such as DRAM units, SRAM units, PROM units, ROM units, Flash memory units and EEPROM units.

Accordingly, the preferred embodiment of a memory defect masking device of the present invention is to be used in combination with a plurality of memory devices which have a plurality of address lines, a plurality of data lines and a control input means for controlling read and write operations of the memory devices. The memory defect masking device comprises at least one entry cell means including: an address cell means having a first memory means for storing the address of a defective memory space of the memory devices and an address comparator means for comparing a memory address present at the address lines with the address stored in the first memory means, said address comparator means generating a control signal to the control input means of the memory devices when the memory address present at the address lines tallies with the address stored in the first memory means, said memory devices being disabled upon reception of the control signal; and a data cell means connected to the data lines of the memory devices and controlled by the address cell means so as to act as a replacement for the defective memory space of the memory devices.

BRIEF DESCRIPTION OF THE DRAWINGS

Other features and advantages of the present invention will become apparent in the following detailed description of the preferred embodiments, with reference to the accompanying drawings, of which.

DETAILED DESCRIPTION OF THE PREFERRED EMBODIMENTS

Figure 1:
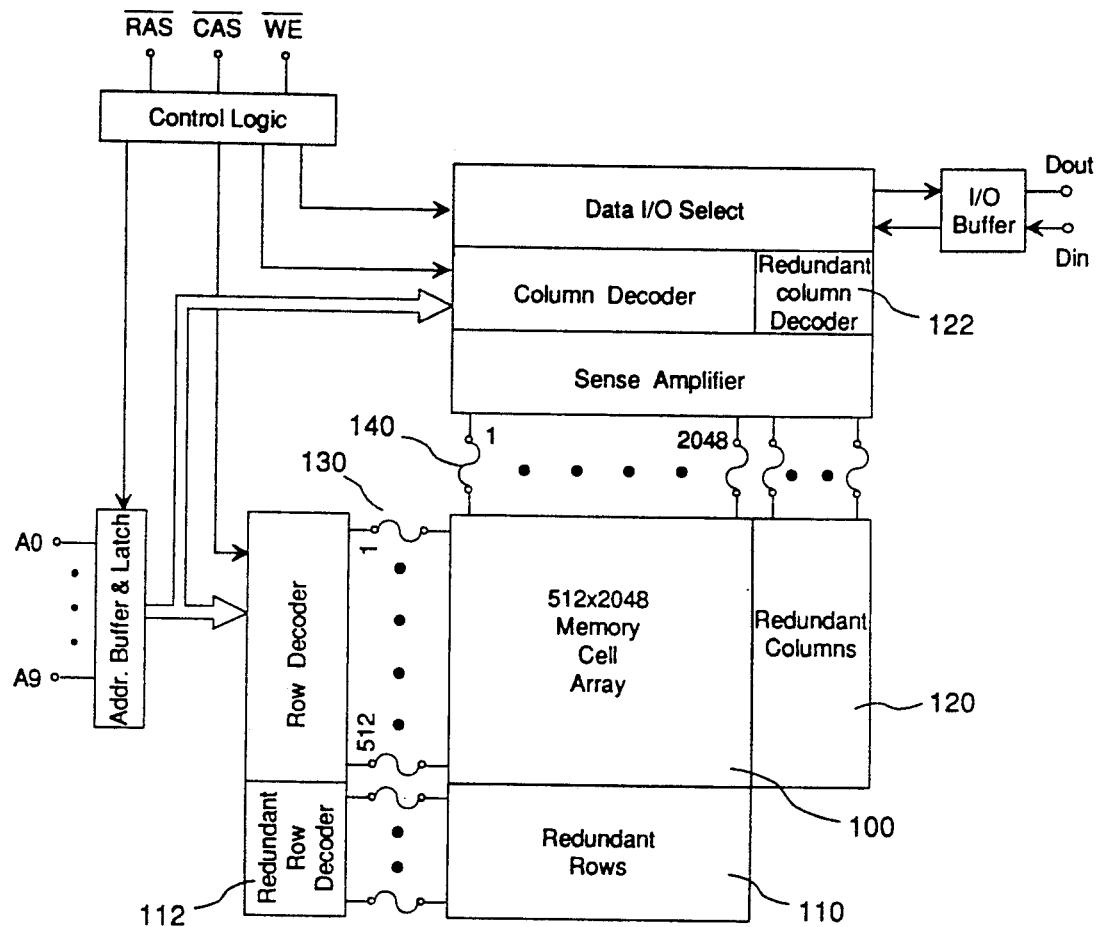
FIG. 1 illustrates how a 1M Bit DRAM unit is conventionally repaired.
Figure 2:
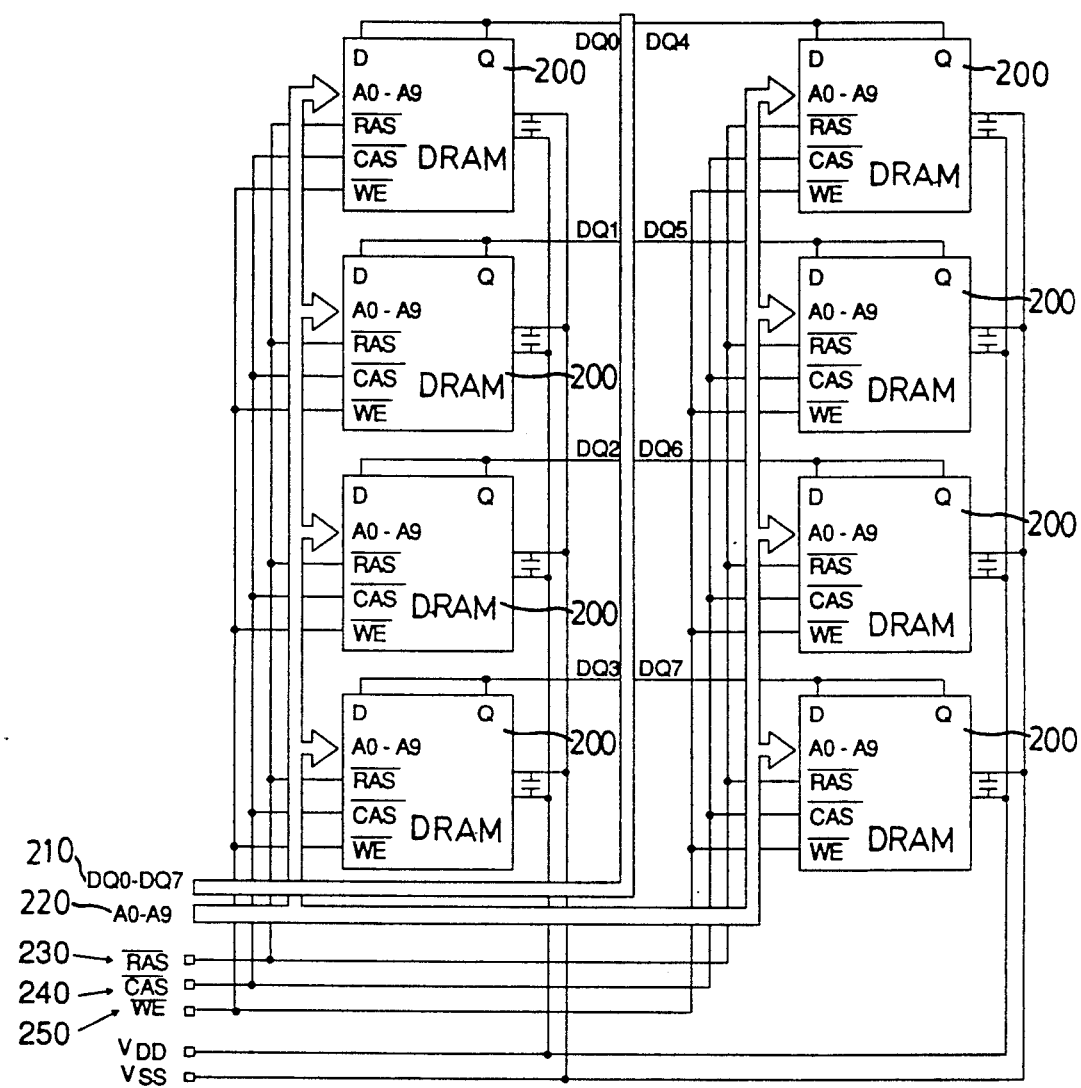
FIG. 2 is an illustration of a conventional 1M Bit×8 DRAM SIMM unit.

FIG. 2 is an illustration of a conventional 1M×8 DRAM SIMM (single in-line memory module) unit. The 1M×8 DRAM SIMM unit comprises eight 1M×1 DRAM units (200). Each DRAM unit (200) has the following signal inputs: two power supply signals (VDD, VSS), address lines (A0–A9) (220), data lines (DQ0–DQ7) (210), a /RAS signal input (230), a /CAS signal input (240) and a /WE signal input (250).

Figure 3:
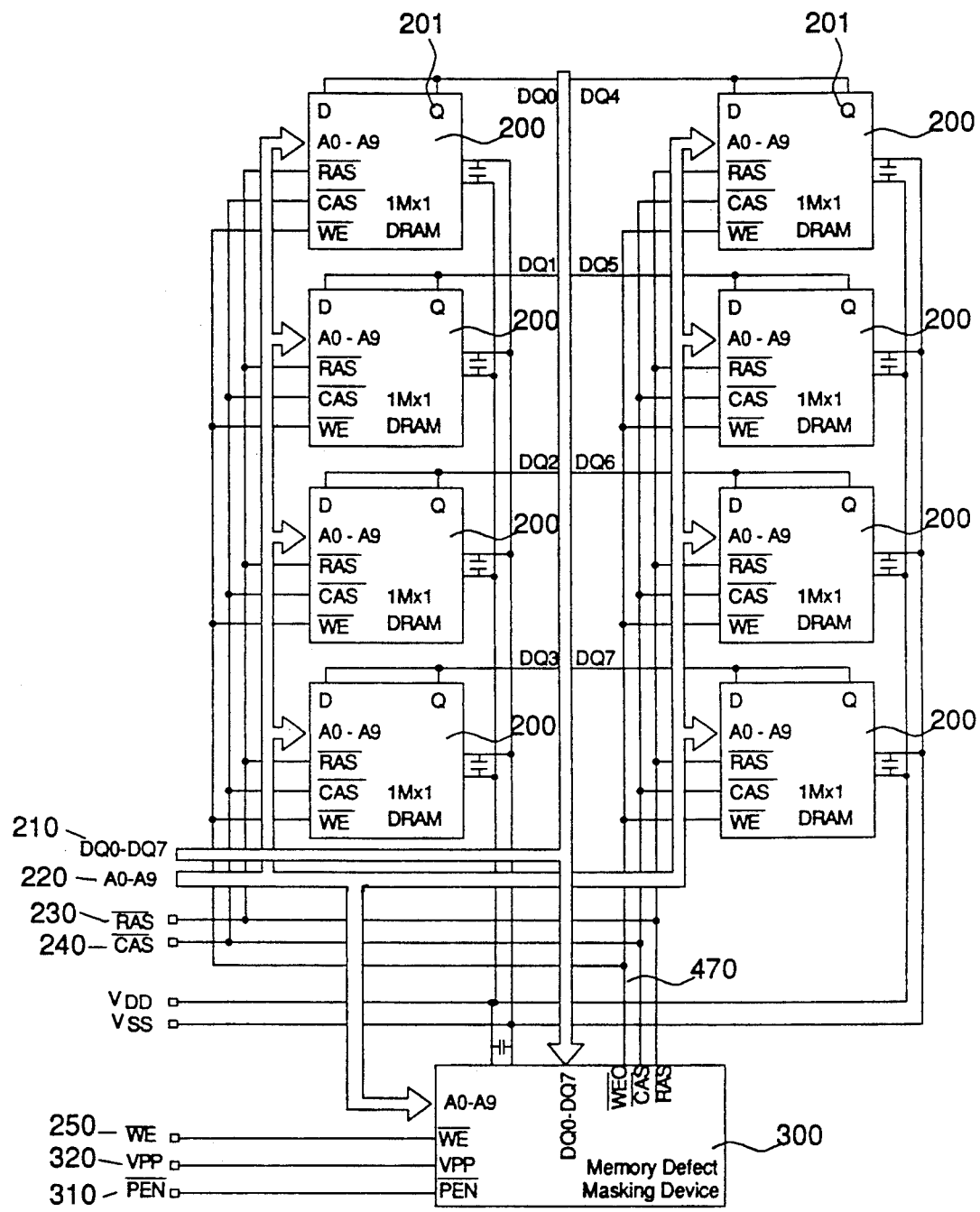
FIG. 3 is an illustration of the first preferred embodiment of a memory defect masking device according to the present invention when used in combination with the 1M Bit×8 DRAM SIMM unit shown in FIG. 2.

FIG. 3 is an illustration of the first preferred embodiment of a memory defect masking device (300) according to the present invention when used in combination with the 1M×8 DRAM SIMM unit shown in FIG. 2. The pin configuration of the memory defect masking device (300) is substantially similar to that of the DRAM units (200). The memory defect masking device (300), however, has data lines (DQ0–DQn), wherein (n) corresponds to the data width of the DRAM SIMM unit and is equal to 7, as shown in FIG. 3. Commonly available DRAM SIMM units have data widths of 8, 9 or 36 bits. The memory defect masking device (300) generates a /WEO output signal (470). The /WE signal input (250) is used to control the read and write operations of the DRAM units (200). In order to achieve the function of masking the defective memory spaces of the DRAM units (200), the /WE signal input (250) is received by the memory defect masking device (300). Upon detection of a defective memory address, an electrical signal is generated at the /WEO output signal (470) of the memory defect masking device (300) so as to place the DRAM units (200) in a "WRITE" state. The respective (Q) data pins (201) of the DRAM units (200) are in a high impedance state when the DRAM units (200) are in the "WRITE" state. The DRAM units (200) thus do not interfere with the information present at the data lines (DQ0–DQ7) (210). The memory defect masking device (300) then reads or writes data to the data lines (DQ0–DQ7) (210) according to the /WE signal input (250), as will be detailed in the succeeding paragraphs.

Figure 4:
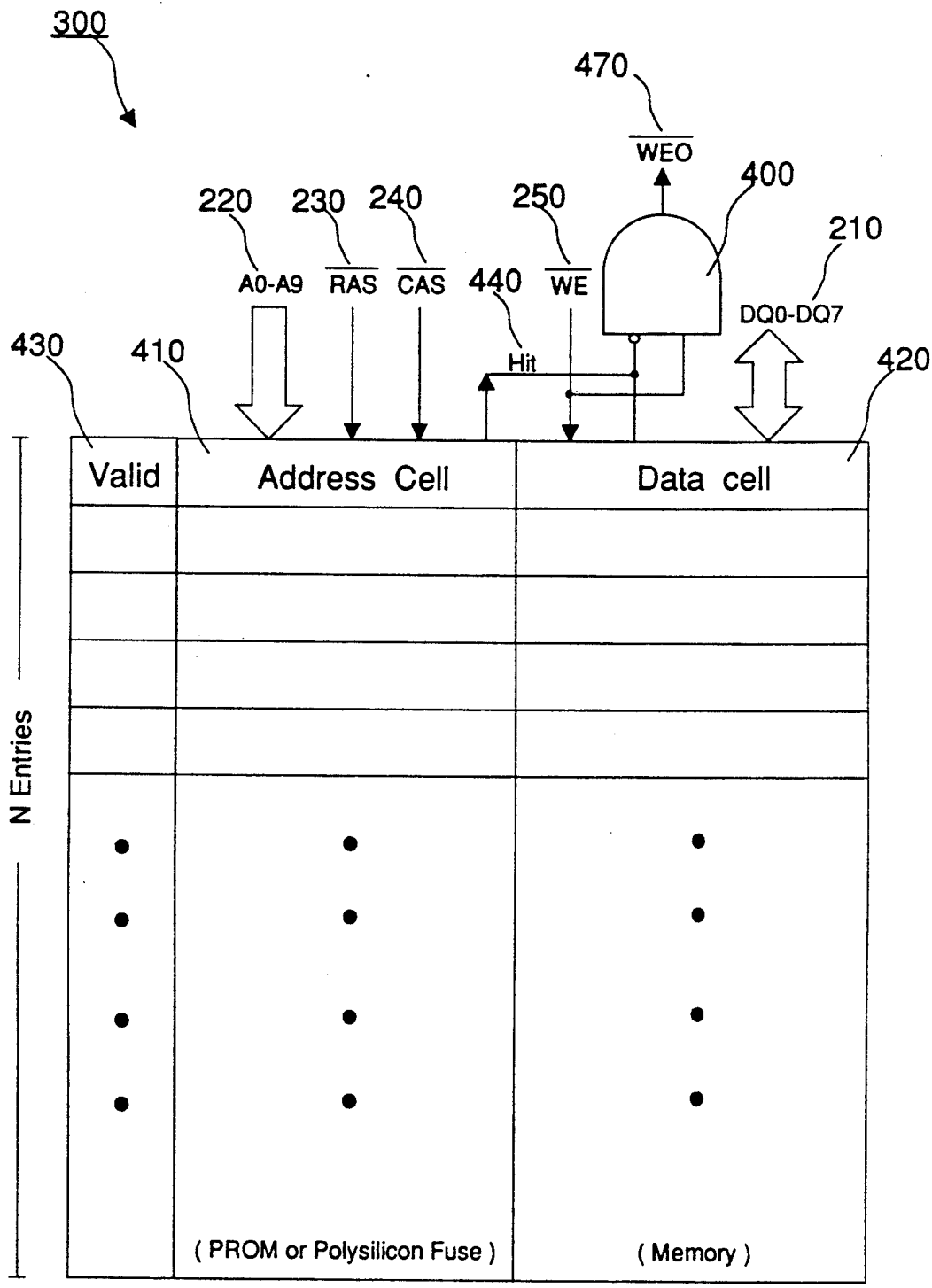
FIG. 4 is a schematic block diagram of the first preferred embodiment.

FIG. 4 is a schematic block diagram of the memory defect masking device (300). The construction of the memory defect masking device (300) is substantially similar to that of a content addressable memory unit or to that of an associate memory unit. The memory defect masking device (300) has (N) masking entry cell means. Each entry cell means comprises a rewritable data cell means (420) (such as an SRAM or EEPROM memory device), a non-volatile address cell means (410) (such as a PROM or poly-silicon fuse device) and a valid bit means (430). The valid bit means (430) is used to indicate if a defective memory address has been stored in the corresponding entry cell means. If the valid bit means (430) is set in the "TRUE" state, the address cell means (410) monitors the address lines (A0–A9) (220). After detecting that the address in the address lines (A0–A9) (220) tallies with the defective memory space address stored in the address cell means (410), a Hit signal (440) is generated. The inverse of the Hit signal (440) serves as one of the inputs to an AND logic gate (400). The /WE signal input (250) serves as the other input to the AND logic gate (400). Each time the Hit signal (440) is generated, the /WEO output signal (470) is in a "TRUE" state, thereby placing the DRAM units (200) in a "WRITE" state. If the Hit signal (440) is not present, the /WEO output signal (470) corresponds to the logic state of the /WE signal input (250) and is received by the DRAM units (200).

When the Hit signal (440) is generated, the data cell means (420) corresponding to the defective memory address is operated according to the /WE signal input (250). When the /WE signal input (250) is in a "TRUE" state, the information present at the data lines (DQ0–DQ7) (210) is stored in the data cell means (420). Otherwise, the data stored in the data cell means (420) is sent to the data lines (DQ0–DQ7) (210). The memory defect masking device (300) thus permits the 1M×8 DRAM SIMM to act as if no defective memory space is present.

Figure 5:
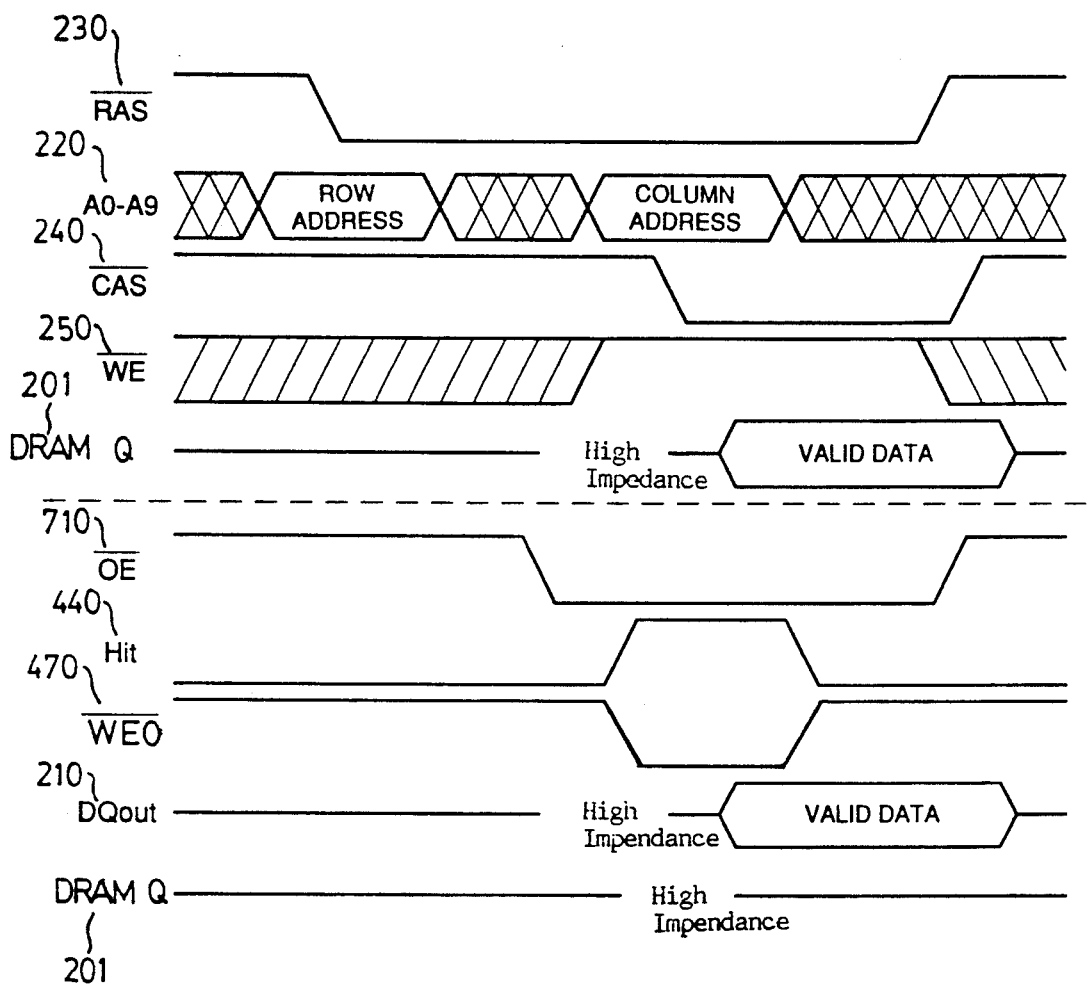
FIG. 5 is a timing diagram illustrating the memory "READ" operation of the circuit shown in FIG. 3.

FIG. 5 is a timing diagram illustrating the "READ" operation of the circuit shown in FIG. 3. Referring to the upper half of FIG. 5, which shows the normal DRAM "READ" operating waveform, the DRAM (Q) pins (201) will send out valid data at the later part of the "READ" operation. Referring to the lower half of FIG. 5, when the Hit signal (440) is generated and is combined with the /WE signal input (250), the /WEO output signal (470) becomes "TRUE." The /WEO output signal (470) will force the DRAM units (200) into a "WRITE" state even though a "READ" operation is intended. The (Q) pins (201) of the DRAM units (200) are in a high impedance state and do not interfere with the information present at the data lines (DQ0–DQ7) (210). Since the /WE signal input (250) is in a "FALSE" state, information stored in the data cell means (420) is sent to the data lines (DQ0–DQ7) (210).

Figure 6:
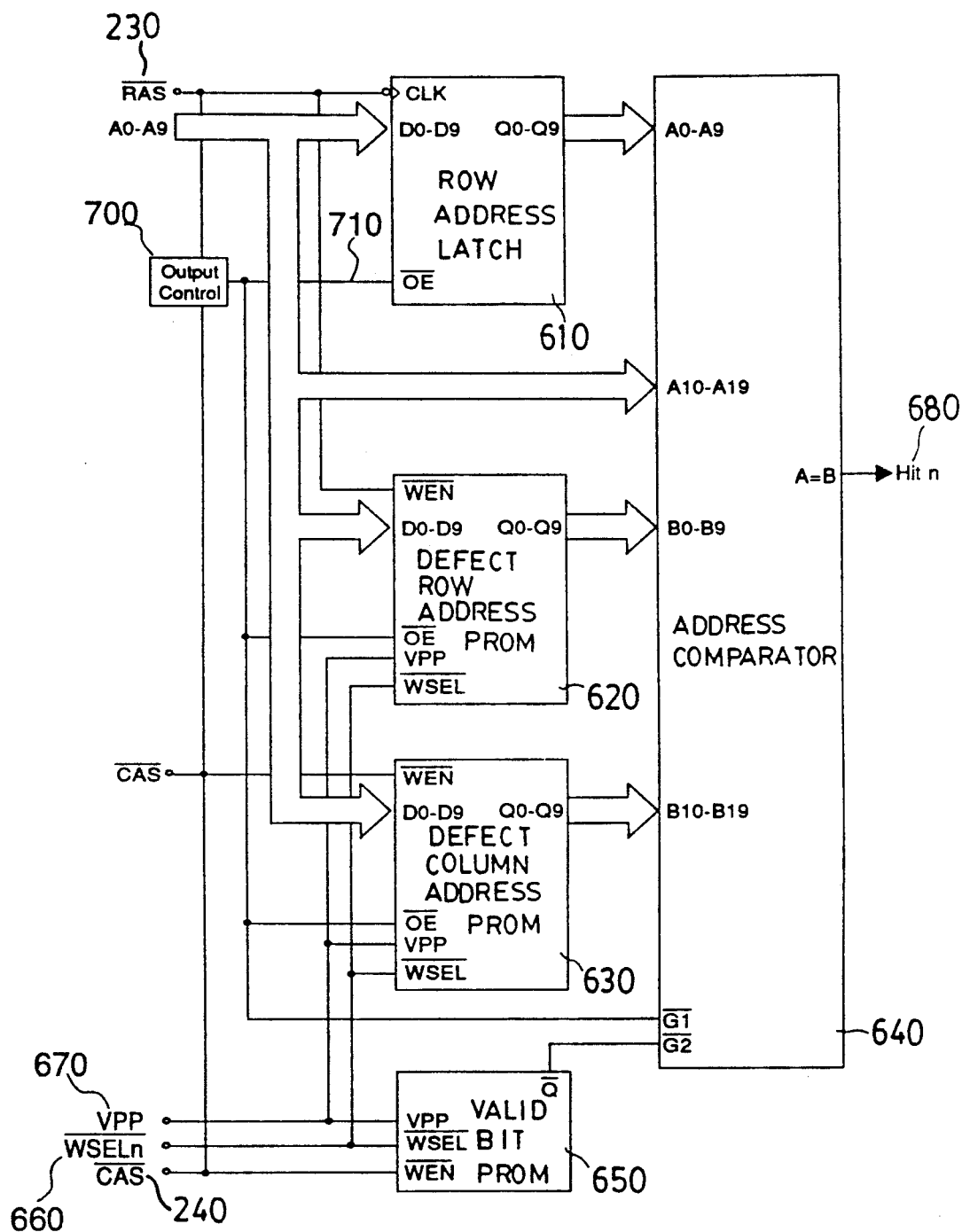
FIG. 6 is a schematic circuit block diagram of an address cell means of the memory defect masking device shown in FIG. 4.

FIG. 6 is a schematic circuit block diagram of an address cell means (410) of the memory defect masking device (300). Each address cell means (410) includes a row address latch (610) which is controlled by the /RAS signal input (230) so as to store the row address therein. A defect row address PROM unit (620) and a defect column address PROM unit (630) are provided for storing a defective memory address of the DRAM units (200). An address comparator (640) compares the information present at the address inputs (A0–A19) with the addresses stored in the PROM units (620, 630). The address comparator (640) generates a $Hit_n$ signal (680) whenever the information present at the address inputs (A0–A19) tallies with the addresses stored in the PROM units (620, 630). An Output Control circuit (700) receives the /RAS and the /CAS signal inputs (230, 240) and determines the type of operation of the DRAM units (200) such as read, write, page mode read, page mode write, read-modified-write, refresh, etc.

Except during the period of the refresh cycle, the Output Control circuit (700) generates a /OE enable signal (710) to the address latch (610) and to the PROM units (620, 630) so as to control the same when sending data to the address comparator (640).

The valid bit means (430) comprises a valid bit PROM unit (650) which controls the operation of the address cell means (410). When the PROM unit (650) is in an unprogrammed state, the (Q) output of the PROM unit (650) is maintained at a "FALSE" state so as to keep the $Hit_n$ signal (680) at a "FALSE" state. When a defective row/column address is stored in the PROM units (620, 630), the $/WSEL_n$ signal input (660) and the VPP signal input (670) to the PROM unit (650) are both in a "TRUE" state, and the (Q) output of the PROM unit (650) changes to a "TRUE" state.

Figure 7:
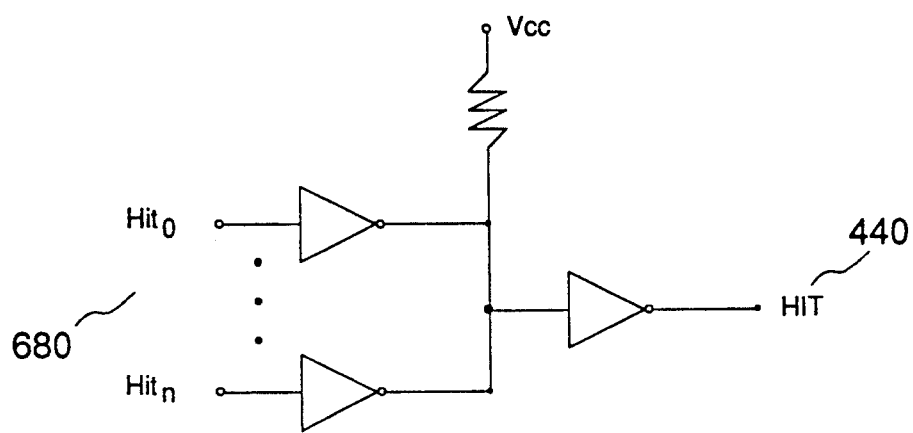
FIG. 7 is a schematic circuit diagram of an output circuit which interconnects the address cell means of the memory defect masking device.

The memory defect masking device (300) has (N) numbers of address cell means (410). The Hit signal (440) is generated whenever one of the address cell means (410) produces the corresponding $Hit_n$ signal (680). FIG. 7 is a schematic circuit diagram illustrating how the Hit signal (440) can be derived from the $Hit_n$ signals (680). A wired-or method can be used so as to derive the Hit signal (440).

Figure 8:
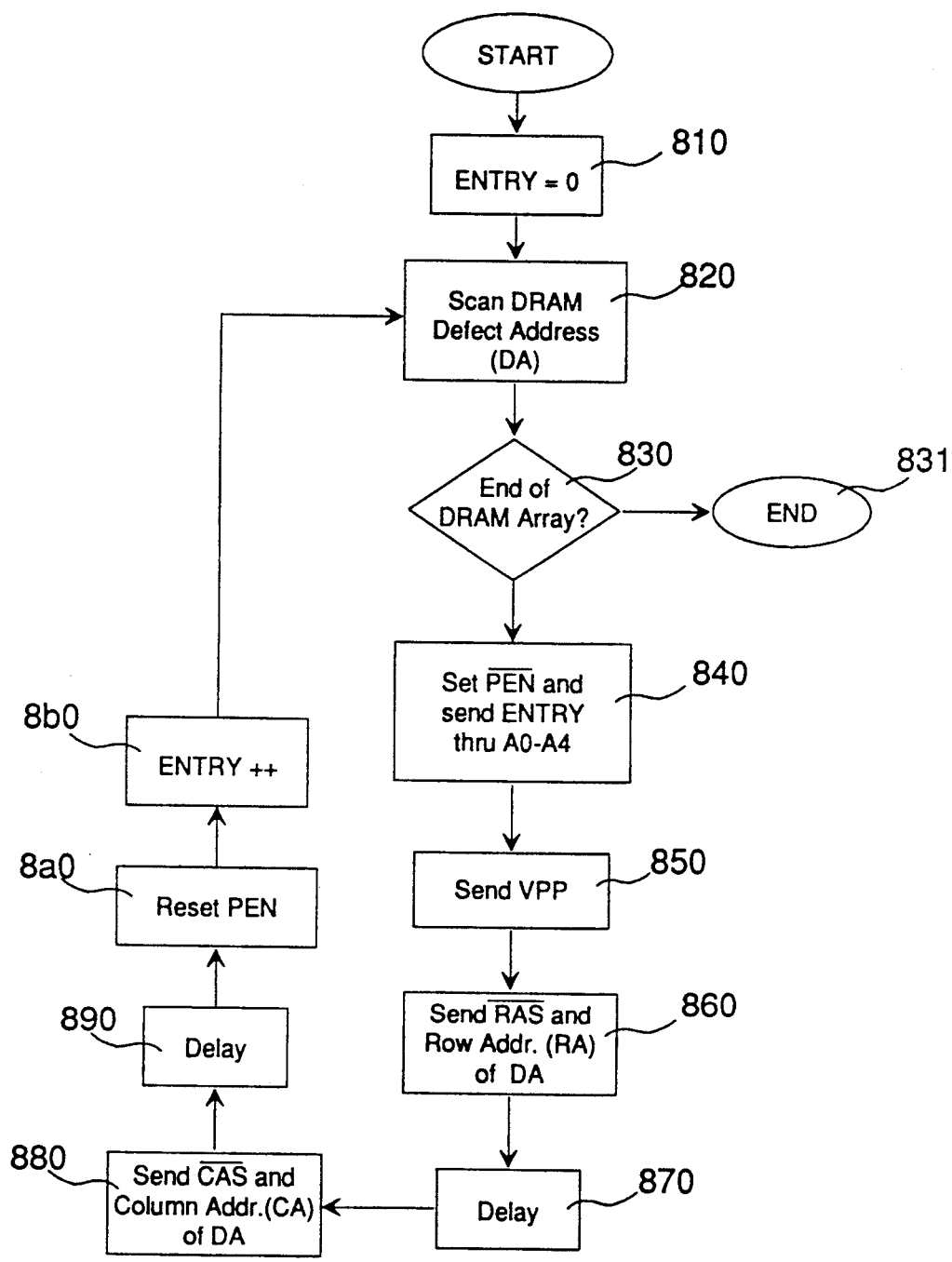
FIG. 8 is a flowchart illustrating how each of the address cell means is programmed.

Referring once more to FIG. 6, the PROM units (620, 630) are used to store the defective memory addresses of the DRAM units (200). FIG. 8 is a flowchart illustrating how the PROM units (620, 630) are programmed to store the defective memory addresses. Each memory defect masking device (300) has (N) numbers of entry cell means. The number (N) must be greater than the total number of defective memory spaces. Thus, if a DRAM unit (200) has a maximum of four defective memory spaces, the memory defect masking device (300) should have thirty-two (4×8) entry cell means so as to mask all of the defective memory spaces of a 1M×8 DRAM SIMM unit.

Figure 11:
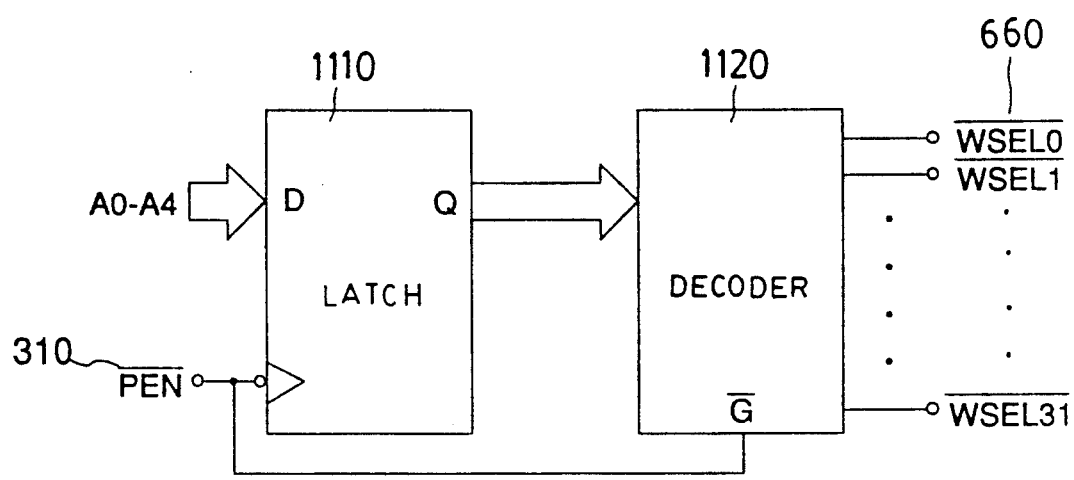
FIG. 11 is a schematic circuit diagram of a memory select circuit for the address cell means.

Referring to FIG. 8, the entry counter of a programmer (not shown) for the memory defect masking device (300) is initially set to zero (Step 810). Scanning of the DRAM units (200) array is then executed (Step 820) until a defective memory address has been detected or until the final memory space of the DRAM units (200) has been reached (Step 830). The programmer terminates the programming procedure when the final memory space has been scanned (Step 831). When a defective memory space has been detected, the programmer sends a /PEN signal output, followed by the entry counter value via the address lines (A0–A4) (Step 840). The entry counter value is received by an entry address latch (1110), as shown in FIG. 11. The output of the latch (1110) is received by a 5-to-32 decoder (1120), which generates the appropriate $/WSEL_n$ signal (660). The $/WSEL_n$ signal (660) activates a corresponding cell of the PROM units (620, 630, 650) of the address cell means (410). After sending the entry counter value, the next steps are to send the VPP power signal (Step 850) and to send the /RAS signal and the defective row address (Step 860). A delay instruction is then executed (Step 870) before the /CAS signal and the defective column address are sent (Step 880). Another delay is executed (Step 890) before the /PEN signal output is disabled (Step 8a0) and the value of the entry counter is incremented by one (Step 8b0). Step 820 is again executed until another defective memory space has been detected.

Figure 9:
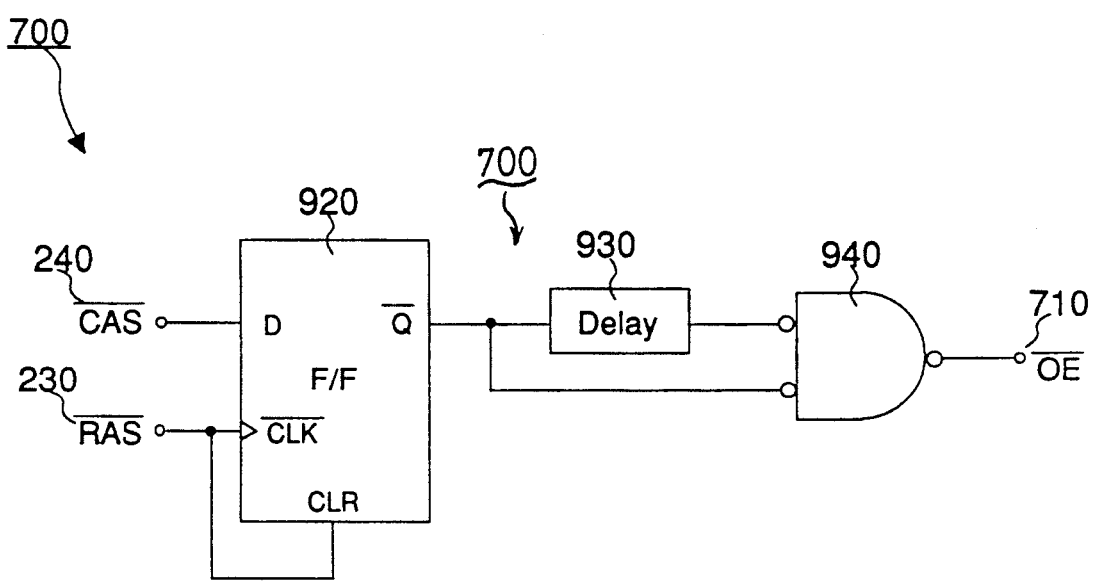
FIG. 9 is a schematic circuit diagram of an Output Control circuit of the address cell means of the memory defect masking device.

FIG. 9 is a schematic circuit diagram of the Output Control circuit (700). The Output Control circuit (700) generates the /OE enable signal (710) to the latch (610) and to the PROM units (620, 630) to enable the same to send data to the address comparator (640) so as to permit the latter to generate the $Hit_n$ signal (680). The Output Control circuit (700) includes a flip-flop (920) which records the logic state of the /CAS signal input (240) when the /RAS signal input (230) is in a low logic state. The memory defect masking device (300) should not be in operation when the /CAS signal input (240) is in a low logic state at this stage, which is indicative of a /CAS-before-/RAS refresh cycle. Referring to FIGS. 5, 6 and 9, when the /RAS signal input (230) is in a "TRUE" state, the row address is present at the address lines (A0–A9) (220). If the address comparator (640) is operated at this stage, the row address which is present at the two sets of address input lines (A0–A9, A10–A19) of the address comparator (640) is matched with the defective memory addresses stored in the PROM units (620, 630). False generation of the $Hit_n$ signal (680) can therefore occur. A delay line (930) is therefore provided to ensure that the /OE enable signal (710) will be generated only when the column address is present at the address lines (A0–A9) (220). The flip-flop (920) is cleared when the /RAS signal input (230) is in a high logic state, thereby clearing the (/Q) output thereof so as to disable the /OE enable signal (710).

Figure 10:
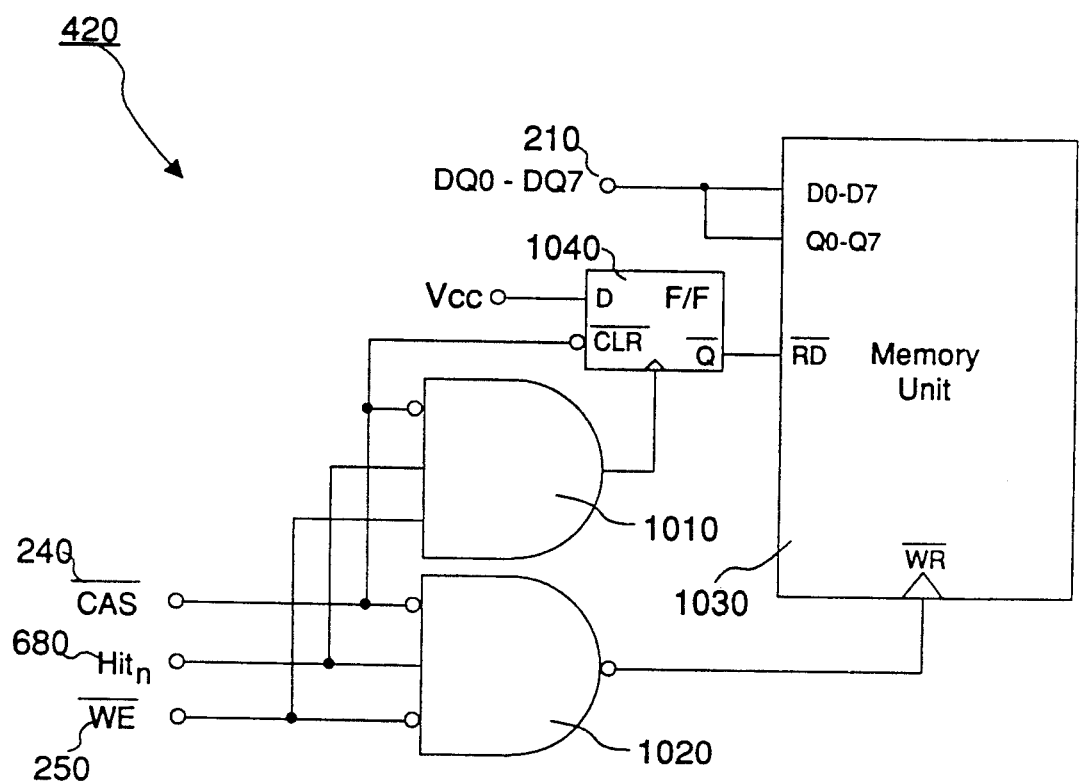
FIG. 10 is a circuit diagram illustrating the construction of a data cell means of the memory defect masking device shown in FIG. 4.

The /OE enable signal (710) may happen to be in a "TRUE" state when the DRAM units (200) are in the /RAS-only refresh period. The memory defect masking device (300) generates the /WEO signal (470) whenever one of the $Hit_n$ signals (680) is in a "TRUE" state. Each of the data cell means (420) of the memory defect masking device (300) operates in accordance with the /CAS and /WE signal inputs, as shown in FIG. 10. Since the /CAS signal input is not generated during the /RAS-only refresh period, erroneous operation of the data cell means (420) does not occur.

The Output Control circuit (700) is used to expedite the generation of the $Hit_n$ signal (680) so as to hasten the generation of the /WEO signal (470). If there exists an "output enable" control for the (Q) pins (201) of the DRAM units (200), then the Output Control circuit (700) can be directly replaced by the /CAS signal. Consequently, the /WEO signal (470) is then used to disable the "output enable" of the DRAM units (200).

FIG. 10 is a circuit diagram illustrating the construction of a data cell means (420) of the memory defect masking device (300). The data cell means (420) includes a memory unit (1030) which is capable of replacing the defective memory space of the DRAM units (200), a NAND logic gate (1020) to control the "WRITE" operation of the memory unit (1030) and an AND logic gate (1010) connected to the clock input of a flip-flop (1040). The flip-flop (1040) controls the "READ" operation of the memory unit (1030). The operation of the data cell means (420) is as follows: Data present at the data lines (DQ0–DQ7) (210) is stored in the data cell means (420) when the $Hit_n$ signal (680), the /CAS signal input (240) and the /WE signal input (250) are all in the "TRUE" state. The data cell means (420) sends information to the data lines (DQ0–DQ7) (210) when the $Hit_n$ signal (680) and the /CAS signal input (240) are present but the /WE signal input (250) is in a "FALSE" state. The data cell means (420) is not in operation when the $Hit_n$ signal (680) is present but the /CAS signal input (240) is absent.

Figure 14:
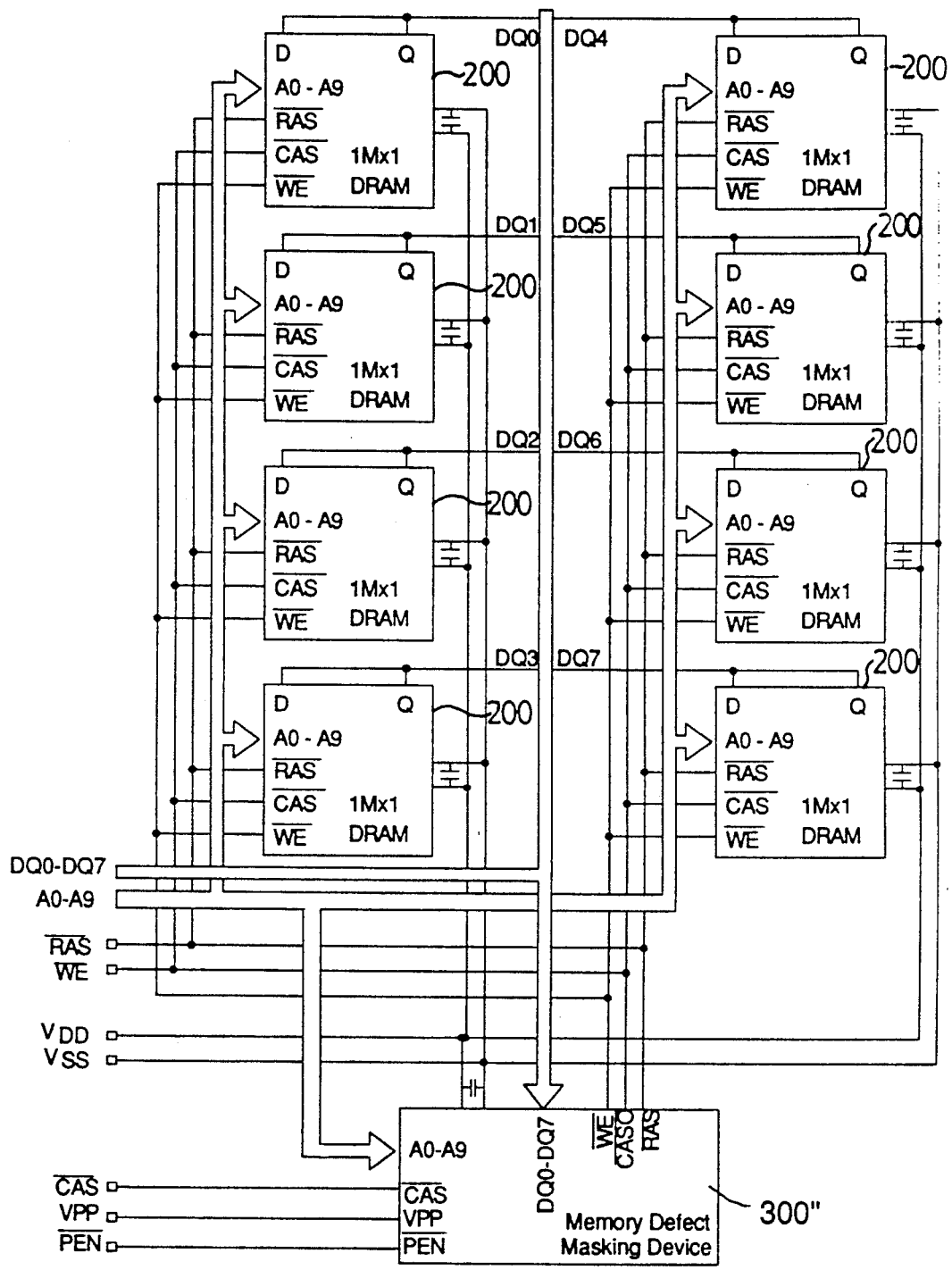
FIG. 14 is an illustration of the second preferred embodiment of a memory defect masking device according to the present invention when used in combination with the 1M Bit×8 DRAM SIMM unit shown in FIG. 2.

In the second preferred embodiment of a memory defect masking device (300″) according to the present invention, the AND gate (400) (Refer to FIG. 4) is used to gate the /CAS signal input to the DRAM units (200) instead of the /WE signal input. If such is the case, the connections of the /WE signal input, the /CAS signal input and the other signal lines of the memory defect masking device (300") are modified accordingly, as shown in FIG. 14.

Figure 15:
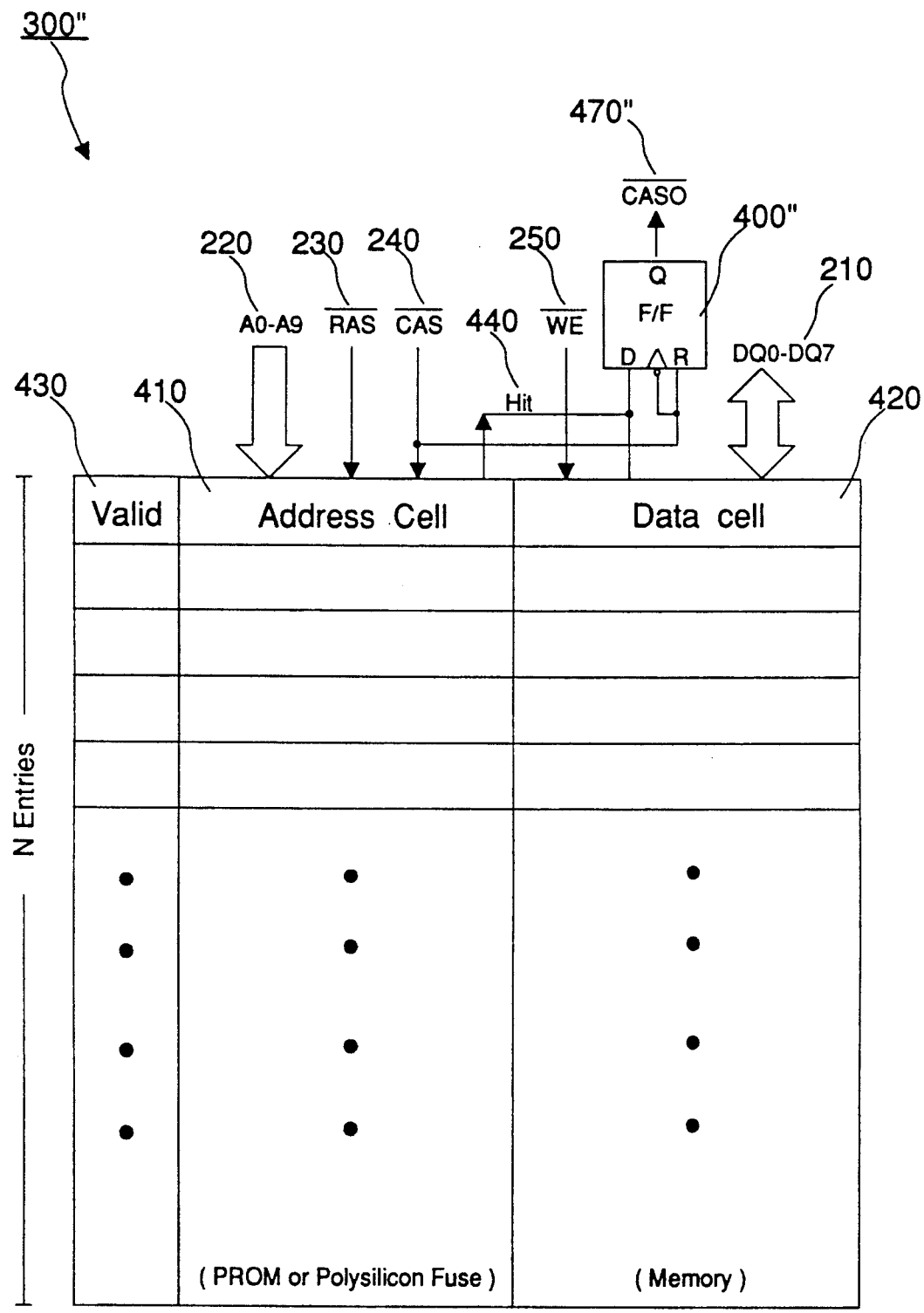
FIG. 15 is a schematic block diagram of the second preferred embodiment.

FIG. 15 shows the required changes in the interconnections of the memory defect masking device (300"). A flip-flop (400") is used to gate the /CAS signal (240) and generates a /CASO signal (470") to the DRAM units (200), thereby inhibiting the latter from providing output data when the Hit signal (440) is present.

Figure 16:
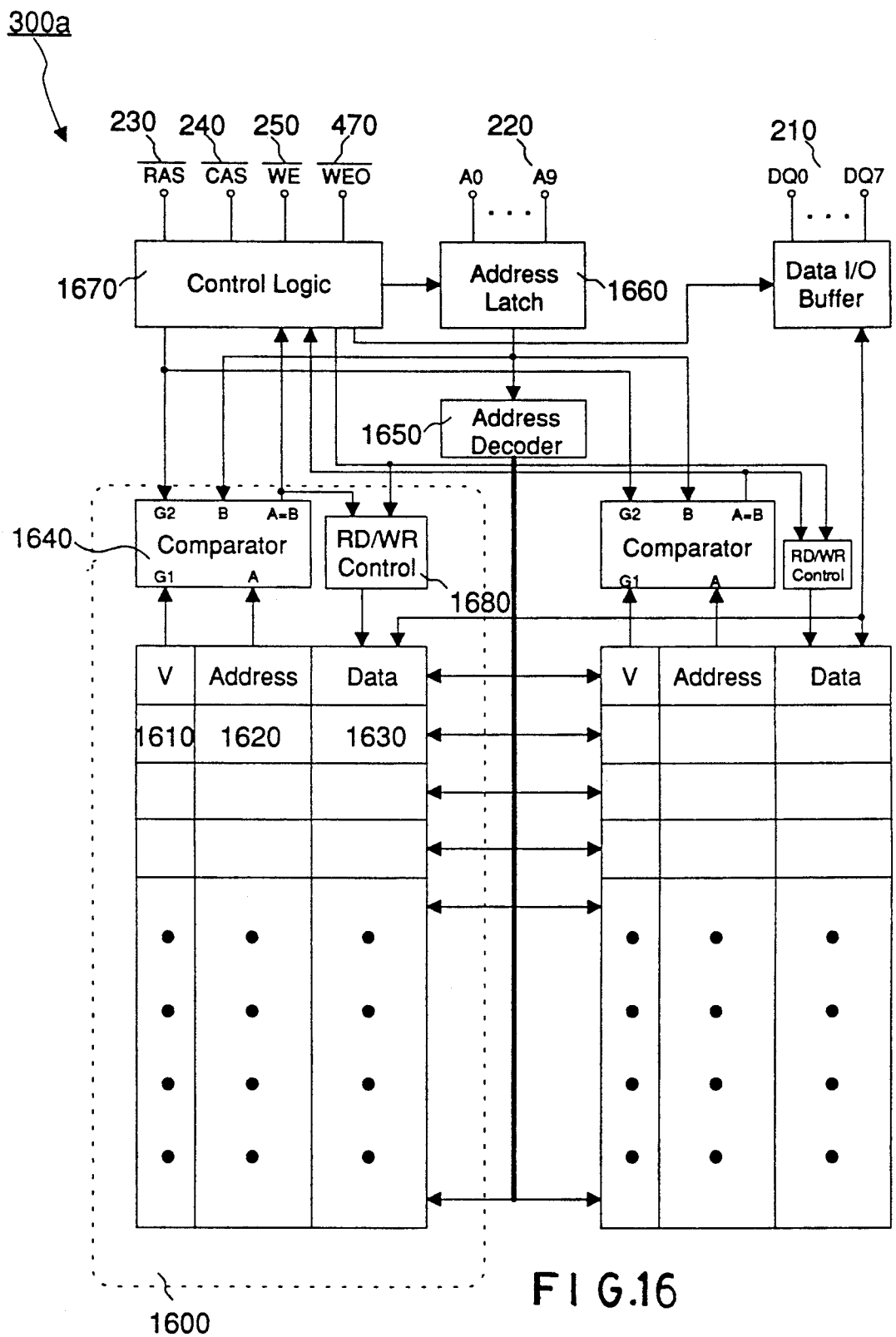
FIG. 16 illustrates the third preferred embodiment of a memory defect masking device having an n-way set associate memory-like structure according to the present invention.

In the third preferred embodiment of a memory defect masking device (300a) according to the present invention, the full associate memory-like architecture shown in FIG. 4 can be replaced by an n-way set associate memory-like structure, as shown in FIG. 16.

The memory defect masking device (300a) can have (n) sets of memory devices (1600). Each of the memory devices (1600) comprises an address comparator (1640) and a memory array including a valid bit memory array (1610), a defect address memory array (1620) and a data memory array (1630). During each /RAS cycle, an address decoder (1650) will enable one of the entries of each of the memory devices (1600), and the address comparator (1640) will then compare the contents of the enabled defect address memory entry (1620) with the memory access address latched by an address latch (1660) from the address lines (A0-A9) (220). When a hit condition occurs, the enabled data memory entry (1630) replaces the defective memory space and the /WEO signal (470) is generated to inhibit the defective memory space from interfering with the information present at the data lines (DQ0-DQ7) (210).

The set associate type architecture of the memory defect masking device (300a) is suitable for memory devices with relatively large numbers of defective memory spaces. However, the set numbers (FIG. 16 shows that the set number is equal to two for the third preferred embodiment) must be large enough so as to properly mask all defective memory spaces.

The foregoing discussion relates to a DRAM SIMM unit. The memory defect masking device of the present invention can also be incorporated in a computer main board or in a memory subsystem. The width of the address cell means (410) and the data cell means (420) can be varied so as to correspond with the specifications of the intended environment. The number of entry cell means can be increased so as to accommodate more defective memory spaces.

Figure 12:
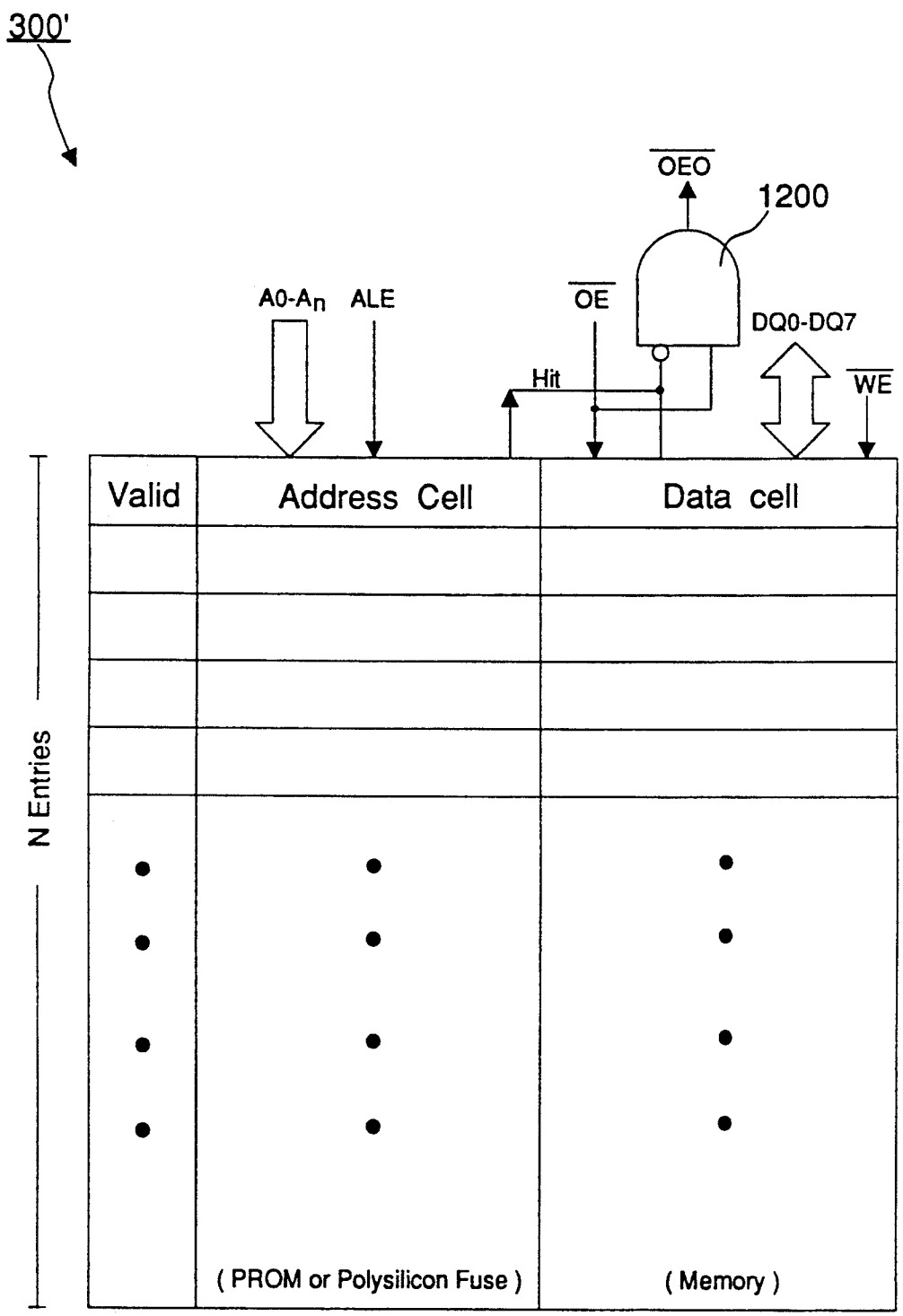
FIG. 12 is an illustration of another preferred embodiment of a memory defect masking device according to the present invention.

If the memory defect masking device of the present invention is to be used with another type of memory device [not a DRAM unit (200)], the memory defect masking device (300) is modified by replacing the /RAS and /CAS address signal inputs by an address latch enable signal (ALE) or a chip select signal (CS) used for recording memory addresses in the memory device (not shown). The connection of the memory defect masking device (300') with the address lines (A0-An) must also be modified, as shown in FIG. 12. Referring to FIG. 12, the /OE enable signal is assumed to be used to control the transfer of information by the external memory device to the data lines (DQ0-DQ7) (210). Therefore, as long as the /OE enable signal is gated by AND gate (1200), the defective memory spaces will not interfere with the data lines (DQ0-DQ7). The data cell means (420) serves as a substitute for the defective memory space of the memory device. Thus, the technology of the data cell means (420) should correspond to the type of memory device. For example, a ROM data cell is required for a ROM memory array. Nevertheless, the data cell means can be designed with only SRAM or EEPROM technology. If the data cell means is configured as a SRAM data cell, the external memory array connected to the memory defect masking device can be a DRAM memory array, a slower SRAM memory array or other types of RAM memory arrays. If the data cell means is configured as an EEPROM data cell, the external memory array connected to the memory defect masking device of the present invention can be a ROM, PROM, EPROM, FLASH or EEPROM.

Figure 13:
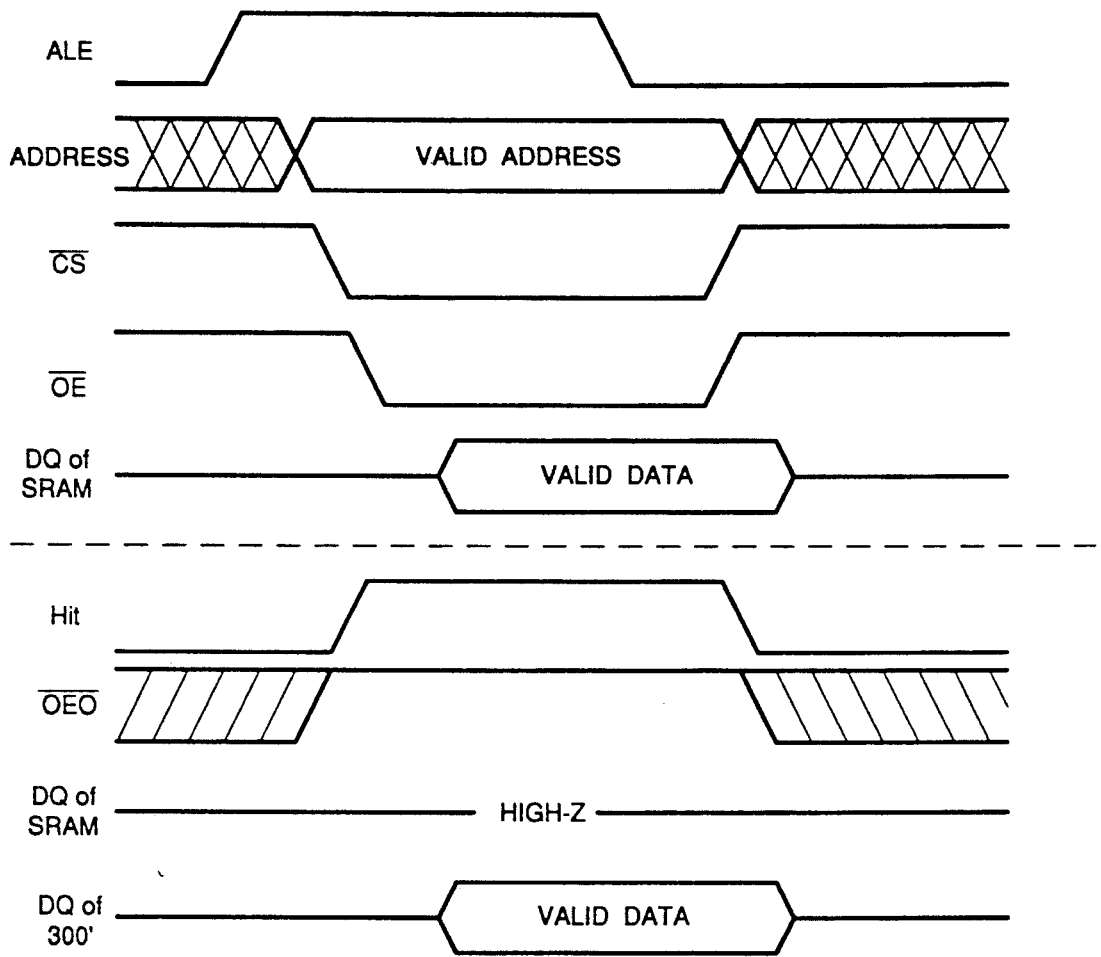
FIG. 13 is a timing diagram illustrating the operation of the memory defect masking device shown in FIG. 12.

FIG. 13 is a timing diagram of the memory defect masking device of the present invention when working with a hypothetical SRAM array. If the memory masking device is working with a PROM, EPROM, Flash or EEPROM array, an additional VPP signal is required. No /WE signal is required if the memory defect masking device is working with a ROM array.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A memory defect masking device to be used in combination with a plurality of defective memory devices having a plurality of address lines, a plurality of data lines and a control input means for controlling read and write operations of said memory devices, said memory defect masking device comprising:

a plurality of masking entry cell means having
  a) an address cell means for storing the address of a defective memory space of said memory devices and a data cell means connected to said data lines of said memory devices and controlled by said address cell means so as to act as a replacement for the defective memory space of said memory devices, said address cell means generating a control signal received by said control input means of said memory devices so as to inhibit said memory devices from providing data to said data lines when the defective memory space are accessed during a memory READ operation, wherein said address cell means comprises:
    i) a defect address memory means for storing the address of a defective memory space of the memory devices,
    ii) an address latch means connected to said address lines of said memory devices, and
    iii) an address comparator means for comparing a memory address present at output lines of said address latch means with said address stored in said defect address memory means, said address comparator means generating said control signal when said memory address present at the output lines of said address latch means tallies with said address stored in said defect address memory means; and
  b) a programmable valid bit means to inhibit said address comparator means for generating said control signal when no address is stored in said defect address memory means.

2. The memory defect masking device as claimed in claim 1, wherein defect address memory means is made of a non-volatile memory device.

3. The memory defect masking device as claimed in claim 2, wherein said non-volatile memory device is a PROM.

4. The memory defect masking device as claimed in claim 2, wherein said non-volatile memory device is an EEPROM.

5. The memory defect masking device as claimed in claim 2, wherein said non-volatile memory device includes poly-silicon fuses.

6. The memory defect masking device as claimed in claim 1, wherein said data cell means is an SRAM memory device.

7. The memory defect masking device as claimed in claim 1, wherein said data cell means is an EEPROM memory device.

8. A memory defect masking device to be used in combination with a plurality of defective memory devices having a plurality of address lines, a plurality of data lines and a control input means for controlling read and write operations of said memory devices, said memory defect masking device comprising:

an address latch means connected to said address lines of said memory devices so as to latch a memory address present at said address lines;

a plurality of memory set means including: a defect address memory array for storing the address of a defective memory space of said memory devices; a data memory array connected to said data lines of said memory devices and serving as a replacement for the defective memory space of said memory devices; a valid bit memory array, each entry of said valid bit memory array being programmed to indicate whether a corresponding entry of said defect address memory array has been programmed to contain the address of a defective memory space; an address decoder means activating one entry of said valid bit memory array, said defect address memory array and said data memory array for each memory accessing cycle; and an address comparator means for comparing a memory address present at output lines of said address latch means with said address stored in an activated entry of said defect address memory array, said address comparator means generating a control signal when said memory address present at the output lines of said address latch means tallies with said address stored in the activated entry of said defect address memory array; and a control logic means receiving said control signal from said address comparator means of said memory set means so as to generate an output disable signal to said memory devices when a defective memory space is being accessed.

* * * * *